(12) United States Patent
Aust et al.

(10) Patent No.: US 12,119,173 B2
(45) Date of Patent: Oct. 15, 2024

(54) MAGNETIC LEVITATION SYSTEM, BASE AND CARRIER OF A MAGNETIC LEVITATION SYSTEM, AND METHOD OF LEVITATING A CARRIER

(71) Applicant: Applied Materials, Inc., Santa Clara, CA (US)

(72) Inventors: Henning Aust, Mühltal (DE); Timo Adler, Gernsheim (DE); Clemens Pihan, Darmstadt (DE)

(73) Assignee: Applied Materials, Inc., Santa Clara, CA (US)

( * ) Notice: Subject to any disclaimer, the term of this patent is extended or adjusted under 35 U.S.C. 154(b) by 382 days.

(21) Appl. No.: 17/607,599

(22) PCT Filed: Apr. 29, 2019

(86) PCT No.: PCT/EP2019/060898
§ 371 (c)(1),
(2) Date: Oct. 29, 2021

(87) PCT Pub. No.: WO2020/221414
PCT Pub. Date: Nov. 5, 2020

(65) Prior Publication Data
US 2022/0208426 A1 Jun. 30, 2022

(51) Int. Cl.
*H01F 7/02* (2006.01)
*C23C 14/50* (2006.01)
(Continued)

(52) U.S. Cl.
CPC ........... *H01F 7/0236* (2013.01); *C23C 14/50* (2013.01); *C23C 14/568* (2013.01);
(Continued)

(58) Field of Classification Search
CPC . H02N 15/00; F16C 32/0472; F16C 32/0451; F16C 32/0457; H01F 7/0236
See application file for complete search history.

(56) References Cited

U.S. PATENT DOCUMENTS

| 4,690,066 A | 9/1987 | Morishita et al. |
| 5,641,054 A * | 6/1997 | Mori ................. H01L 21/67184 |
| | | 198/465.1 |

FOREIGN PATENT DOCUMENTS

| CN | 202704767 U | 1/2013 | |
| KR | 2011049936 A * | 5/2011 | .............. B60L 13/04 |

(Continued)

OTHER PUBLICATIONS

Machine translation of KR-2014111420-A (Year: 2014).*
(Continued)

*Primary Examiner* — Steven H Whitesell
(74) *Attorney, Agent, or Firm* — Patterson + Sheridan, LLP (57) ABSTRACT

A magnetic levitation system for transporting a carrier is described. The magnetic levitation system includes a base defining a transportation track, a carrier movable relative to the base along the transportation track, and a plurality of active magnetic bearings provided at the base and configured to face a guided structure of the carrier. The guided structure includes a first guided zone and a second guided zone configured to interact with the plurality of active magnetic bearings and a recessed zone. The recessed zone is arranged between the first guided zone and the second guided zone in a transport direction of the carrier and is recessed with respect to the first guided zone and the second guided zone.

19 Claims, 2 Drawing Sheets

(51) Int. Cl.
*C23C 14/56* (2006.01)
*C23C 16/458* (2006.01)
*C23C 16/54* (2006.01)
*H01L 21/677* (2006.01)

(52) U.S. Cl.
CPC .......... *C23C 16/4587* (2013.01); *C23C 16/54* (2013.01); *H01L 21/67709* (2013.01); *H01L 21/6776* (2013.01)

(56) References Cited

FOREIGN PATENT DOCUMENTS

| KR | 2012059933 A | * | 6/2012 | .............. B60L 13/04 |
|----|--------------|---|--------|---------------------------|
| KR | 2014111420 A | * | 9/2014 | |
| KR | 20150078173 A | | 7/2015 | |
| KR | 20150078175 A | | 7/2015 | |
| KR | 20190038328 A | | 4/2019 | |
| WO | 2017/198298 A1 | | 11/2017 | |
| WO | 2019/015783 A1 | | 1/2019 | |
| WO | 2019/037858 A1 | | 2/2019 | |
| WO | 2019/052657 A1 | | 3/2019 | |

OTHER PUBLICATIONS

Machine translation of KR-2012059933-A (Year: 2012).*
Machine translation of KR-2011049936-A (Year: 2011).*
International Search Report and Written Opinion, PCT/EP2019/060898, Jan. 28, 2020.
Chinese Application No. 201980095601.6, Office Action dated Jan. 24, 2024, 18 pages.
Korean Application No. 10-2021-7038651, Office Action dated Feb. 15, 2024, 10 pages.
Korean Application No. 10-2021-7038651, Notice of Allowance dated May 23, 2024, 3 pages.

* cited by examiner

MAGNETIC LEVITATION SYSTEM, BASE AND CARRIER OF A MAGNETIC LEVITATION SYSTEM, AND METHOD OF LEVITATING A CARRIER

TECHNICAL FIELD

Embodiments of the present disclosure relate to systems and methods for transportation of carriers, particularly carriers used for carrying large-area substrates. More specifically, embodiments of the present disclosure relate to magnetic levitation systems for levitating and transporting carriers, particularly in a vacuum chamber. In particular, embodiments of the present disclosure relate to a magnetic levitation system for transporting a carrier, a carrier of a magnetic levitation system, a base of a magnetic levitation system, and methods of levitating a carrier.

BACKGROUND

Techniques for layer deposition on a substrate include, for example, sputter deposition, physical vapor deposition (PVD), chemical vapor deposition (CVD) and thermal evaporation. Coated substrates may be used in several applications and in several technical fields. For instance, coated substrates may be used in the field of display devices. Display devices can be used for the manufacture of television screens, computer monitors, mobile phones, other hand-held devices, and the like for displaying information. Typically, displays are produced by coating a substrate with a stack of layers of different materials.

Substrates are typically coated in a vacuum deposition system which may include a plurality of deposition sources and other substrate processing apparatuses. The substrates are typically transported through the vacuum deposition system along a transportation track, e.g. from a first deposition source to a second deposition source and to other substrate processing apparatuses. The substrates may be transported through the vacuum system in an essentially vertical orientation.

A substrate is typically carried by a carrier, i.e. a carrying device for carrying the substrate. The carrier is typically transported through the vacuum system using a carrier transport system, e.g. a magnetic levitation system in which the weight of the carrier is held by magnetic forces. The carrier transport system may be configured for conveying the carrier carrying the substrate along a base structure that defines a transportation track.

An accurate and smooth transportation of the carriers through a vacuum system is challenging. For instance, particle generation due to friction between moving parts can cause a deterioration in the manufacturing process. Transporting the carrier with a magnetic levitation system can decrease the particle generation because the mechanical contact between moving parts is reduced. For example, the magnetic levitation system may include a base with a plurality of actively controlled magnetic bearings which generate a magnetic levitation force for holding the carrier at the base in a contactless or essentially contactless manner. However, it is difficult to transport large-area carriers having a size of several square meters with a magnetic levitation system, since the tolerance requirements increase with the size of the object that is to be transported.

Accordingly, it would be beneficial to provide improved magnetic levitation systems for levitating and transporting carriers in a vacuum system as well as improved methods of levitating carriers in a vacuum system, which overcome at least some problems of the state of the art. Specifically, providing magnetic levitation systems for transporting carriers carrying large-area substrates would be beneficial.

SUMMARY

In light of the above, magnetic levitation systems for transporting a carrier, a carrier of a magnetic levitation system, a base of a magnetic levitation system, and methods of levitating a carrier are provided. Further aspects, advantages, and features are apparent from the dependent claims, the description, and the accompanying drawings.

According to an aspect of the present disclosure, a magnetic levitation system for transporting a carrier is provided. The magnetic levitation system includes a base defining a transportation track, a carrier that is movable along the transportation track, and a plurality of active magnetic bearings provided at the base and configured to face a guided structure of the carrier. The guided structure of the carrier includes a first guided zone, a second guided zone, and a recessed zone arranged between the first guided zone and the second guided zone in a transport direction of the carrier. The first guided zone and the second guided zone are configured to interact with the plurality of active magnetic bearings, and the recessed zone is recessed with respect to the first guided zone and the second guided zone.

According to an aspect of the present disclosure, a carrier of a magnetic levitation system is provided, the carrier being movable along a transportation track defined by a base. The carrier includes a guided structure including a first guided zone and a second guided zone configured to magnetically interact with a plurality of active magnetic bearings arranged at the base, and a recessed zone arranged between the first guided zone and the second guided zone in a transport direction of the carrier, the recessed zone being recessed with respect to the first guided zone and the second guided zone.

According to an aspect of the present disclosure, a base of a magnetic levitation system is provided, the base defining a transportation track for a carrier. The base includes a plurality of active magnetic bearings for generating a levitation force for holding the carrier, and one or more controllers for individually controlling the plurality of active magnetic bearings depending on a carrier position along the transportation track. The one or more controllers are configured to actively control a first subset of the plurality of active magnetic bearings facing one of a first guided zone and a second guided zone of the carrier and to not actively control a second subset of the plurality of active magnetic bearings facing a recessed zone of the carrier arranged between the first guided zone and the second guided zone.

In other words, the one or more controllers may be configured to actively control a first subset of the plurality of active magnetic bearings facing two distant zones of a carrier and to not actively control a second subset of the plurality of active magnetic bearings facing a recessed zone of the carrier arranged between the two distant zones.

According to a further aspect of the present disclosure, a method of levitating a carrier is provided, the carrier including a first guided zone, a second guided zone, and a recessed zone arranged between the first guided zone and the second guided zone in a transport direction of the carrier. The method includes controlling a plurality of active magnetic bearings for levitating the carrier with respect to a base, wherein a first subset of the plurality of active magnetic bearings facing one of the first guided zone and the second guided zone is actively controlled, or switched on, and a second subset of the plurality of active magnetic bearings facing the recessed zone is not actively controlled, or switched off.

The carrier may be a carrier for carrying a large-area substrate, particularly a substrate having a size of 1 m² or more, particularly 5 m² or more, more particularly 10 m² or more. The substrate that is carried by the carrier may be a large-area substrate for display manufacturing. The carrier may be configured for carrying the substrate in an essentially vertical orientation.

The magnetic levitation system may be configured for transporting the carrier through a vacuum deposition system with deposition sources for depositing a layer stack on the substrate that is carried by the carrier.

The magnetic levitation system may be configured for a contactless or essentially contactless transportation of the carrier, such that particle generation due to frictional forces can be reduced or avoided.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The methods for operating the described apparatus include method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Reference will now be made in detail to the various embodiments of the disclosure, one or more examples of which are illustrated in the figures. Within the following description of the drawings, the same reference numbers refer to same components. Only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Figure 1:
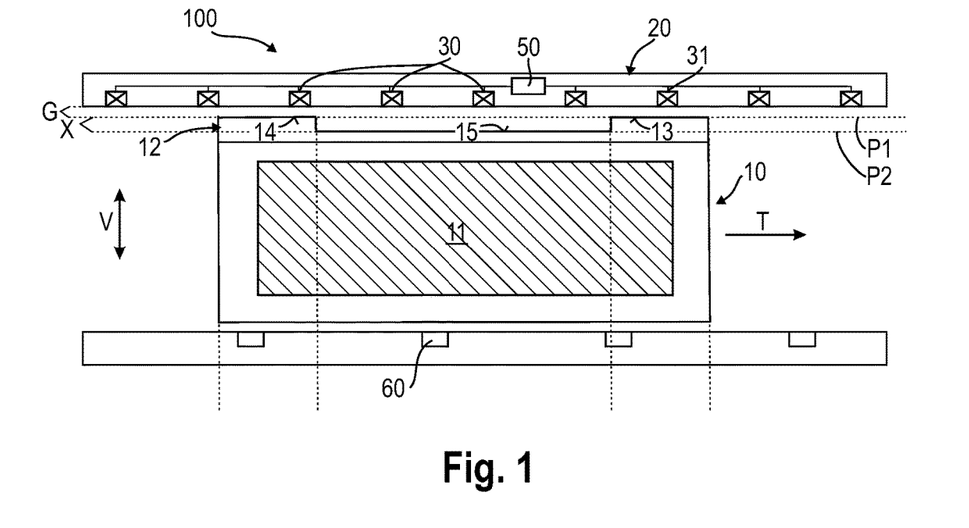
FIG. 1 shows a schematic front view of a magnetic levitation system according to embodiments described herein, the magnetic levitation system including a base and a carrier according to embodiments described herein.

FIG. 1 is a schematic view of a magnetic levitation system 100 according to embodiments described herein. The magnetic levitation system 100 includes a base 20 that defines a transportation track and a carrier 10 that is movable along the transportation track in a transport direction T which is typically an essentially horizontal direction.

The magnetic levitation system 100 described herein may be a carrier transport system configured for holding and transporting a carrier in a vacuum environment, particularly in a vacuum chamber or in a vacuum system including a plurality of vacuum chambers arranged next to each other, e.g. in a linear or 2-dimensional array. Specifically, the magnetic levitation system 100 may be a part of a vacuum processing system, particularly of a vacuum deposition system configured for depositing a material on a substrate that is carried by the carrier.

A "carrier" as used herein may be understood as a carrying device configured for carrying an object, particularly a substrate that is to be coated, through a vacuum environment. The carrier may include a carrier body and a holding device, e.g. a mechanical, electrostatic, or magnetic chucking device, configured for holding the substrate at a support surface of the carrier body.

The carrier may be configured to carry a large-area substrate, i.e. a substrate having a size of 1 m² or more, particularly 5 m² or more, more particularly 8 m² or more or even 10 m² or more. Accordingly, the carrier may be a large and heavy component, the carrier body having a substrate support surface of several square meters. For example, the carrier may have a weight of 200 kg or more, e.g. from 400 kg to 2000 kg, such as 1000 kg or more, and/or a length of several meters. Transporting and holding large and heavy carriers with levitation magnets of a magnetic levitation system is challenging.

A "magnetic levitation system" as used herein may be understood as a carrier transport system configured to hold at least a part of the weight of the carrier or the whole weight of the carrier by magnetic forces. For example, the carrier may be held in a contactless manner or in an essentially contactless manner with respect to the base during the transport along the transportation track. The magnetic levitation system may include a plurality of levitation magnets for levitating the carrier relative to the base, e.g. active and/or passive levitation magnets, such as a plurality of active magnetic bearings.

The base is typically a stationary structure along which the carrier can be moved. In one embodiment, the base includes a rail or track structure where the levitation magnets are provided at regular intervals. For example, the base may extend from a first vacuum chamber in which substrates can be loaded on carriers to a second vacuum chamber in which a deposition source for coating the substrates is arranged. The carrier can typically be transported along the base with a drive unit, e.g. a linear motor.

As is schematically depicted in FIG. 1, the magnetic levitation system 100 includes a plurality of active magnetic bearings 30 provided at the base 20. An active magnetic bearing is a magnetic bearing that is actively controlled. Actively controlled magnetic bearings are configured to hold the carrier at the base at a predetermined distance by applying magnetic forces. For example, each active magnetic bearing may include an actuator with a controllable magnet (e.g., an electromagnet) that is arranged at the base, e.g. at a top rail of the base. The actuator may be actively controllable for maintaining a predetermined distance (or "gap G") between the base 20 and the carrier 10.

For example, an output parameter, such as an electric current which is applied to the actuator, may be controlled depending on an input parameter, such as a distance between the carrier and the base. A distance between the base and the carrier may be measured with a distance sensor, and the magnetic field strength of the actuator may be set depending on the measured distance. Specifically, the magnetic field strength may be increased in the case of a distance above a predetermined threshold value, and the magnetic field strength may be decreased in the case of a distance below a threshold value. The actuator may be controlled in a closed loop or feedback control.

Each magnetic bearing of the plurality of active magnetic bearings 30 may include an actuator (e.g., an electromagnet) and a distance sensor. A controller may be provided for controlling the actuator depending on the distance measured by the distance sensor. Each magnetic bearing may have a respective controller. Alternatively, one common controller may be provided for controlling a plurality of active magnetic bearings.

The plurality of active magnetic bearings 30 are configured to face a guided structure 12 of the carrier during the transport of the carrier along the transportation track. The guided structure 12 of the carrier may include a magnetic component with an upwardly facing surface that is directed toward the plurality of active magnetic bearings 30. The magnetic component of the guided structure 12 may include a ferromagnetic material, e.g. an iron alloy such as steel. A controlled attractive force can be generated between the guided structure 12 of the carrier and at least some of the active magnetic bearings, such that the carrier can be levitated. The guided structure 12 may be an upper part of the carrier body that is configured to magnetically interact with the plurality of active magnetic bearings 30.

During the transport of the carrier 10 in a floating state in the transport direction T, the plurality of active magnetic bearings 30 are typically controlled such that the distance (or "gap G") between the base 20 and the carrier 10 remains essentially constant, e.g. in a range between 0.5 mm and 2 mm, such as about 1 mm or 1.5 mm.

However, if the carrier 10 is very long and heavy, maintaining an essentially constant gap over the whole length of the carrier 10 is difficult. In this case, the base and the guided structure of the carrier need to be manufactured with a very high accuracy and flatness, since a variation of the surface flatness or a carrier curvature beyond an allowed level would lead to a contact between the carrier and the base or would even make a magnetic levitation of the carrier impossible. Further, there is a risk that the base or the carrier may bend due to pressure or temperature changes in the vacuum system, such that maintaining a constant gap width by the control of the plurality of active magnetic bearings may be difficult or impossible.

Embodiments described herein allow for a magnetic levitation of long and heavyweight carriers. The guided structure 12 of the carrier 10 described herein includes a first guided zone 13 and a second guided zone 14 configured to interact with the plurality of active magnetic bearings 30, and a recessed zone 15 arranged between the first guided zone 13 and the second guided zone 14 in the transport direction T of the carrier, i.e. in the longitudinal direction of the carrier. The recessed zone 15 is recessed with respect to the first guided zone 13 and the second guided zone 14. For example, the recessed zone 15 may be recessed with respect to the first and second guided zones by at least 2 mm or more, particularly 3 mm or more (recess depth X in FIG. 1). In other words, the recessed zone 15 may form a deepened or indented portion in the guided structure 12 of the carrier that is more distant from the plurality of active magnetic bearings 30 as compared to the first guided zone 13 and the second guided zone 14 during the carrier transport.

Only the first guided zone 13 and the second guided zone 14 may magnetically interact with actively controlled magnetic bearings of the plurality of active magnetic bearings 30 during the carrier transport. Specifically, a first gap between the first guided zone 13 and the base 20 may be controlled to remain essentially constant, e.g. in a range from G=0.5 mm to G=2 mm, and a second gap between the second guided zone 14 and the base may be controlled to remain essentially constant, e.g. in a range from G=0.5 mm to G=2 mm. The distance between the recessed zone 15 and the base 20 is larger, e.g. 4 mm or more, particularly 5 mm or more, corresponding to the sum of the gap G and the recess depth X.

According to embodiments described herein, there is no need to provide one single highly flat actuator surface of the base 20 and one single highly flat guided zone of the carrier 10. Rather, the active magnetic bearings magnetically interact with two separate and distant zones of the carrier, namely with the first guided zone 13 and the second guided zone 14. The active magnetic bearings are controlled to hold the first and second guided zones at predetermined small distances from the base, respectively. Accordingly, even if the carrier and/or the base bend due to temperature or pressure variations, there is no risk of a contact between the guided structure 12 and the base 20, the distance between the recessed zone 15 and the base 20 during the carrier transport being sufficiently large to avoid any risk of contact. A smooth and reliable levitation of long carriers becomes possible.

In some embodiments, which may be combined with other embodiments described herein, the first guided zone 13 and the second guided zone 14 define a first plane P1. In other words, the first guided zone 13 and the second guided zone 14 lie essentially in the same plane, the first plane P1 having a first distance (corresponding to the gap G) from the plurality of active magnetic bearings 30 during the carrier transport. For example, the guided structure 12 of the carrier may include a magnetic material component with a first upwardly facing surface in a front portion of the carrier which constitutes the first guided zone 13 and a second upwardly facing surface in a rear portion of the carrier in the transport direction T which constitutes the second guided zone 14. The first and second upwardly facing surfaces may lie essentially in the same plane during the carrier transport, namely in the first plane P1.

In some embodiments, the recessed zone 15 defines a second plane P2, the second plane P2 having a second distance from the plurality of active magnetic bearings greater than the first distance during the carrier transport. The recessed zone 15 may have an upwardly facing surface that is arranged between the first guided zone and the second guided zone and is recessed with respect to the first guided zone and the second guided zone by at least the second distance. The recessed zone 15 may have an essentially flat surface. In other embodiments, the recessed zone 15 is not completely flat. Yet, it is beneficial that the recessed zone 15 is recessed with respect to both the first guided zone 13 and the second guided zone 14 by a recess depth X of at least 2 mm or by at least 4 mm over the whole extension between the first guided zone 13 and the second guided zone 14, such that a contact between the base and the carrier can be reliably avoided.

In some embodiments, the first distance (corresponding to the gap G) is 2 mm or less, particularly about 1.5 mm, and/or the second distance (corresponding to the sum G+X) is 3 mm or more, particularly about 5 mm. In other words, the second plane P2 may be recessed with respect to the first plane P1 by a recess depth X of at least 1 mm, particularly 3 mm or more. Accordingly, even if the recessed zone 15 has some curvature or is uneven, there is no risk of a contact between the recessed zone 15 and the base 20, when the gap G between the first and second guided zones and the base is controlled to stay in a predetermined range below 2 mm.

In some embodiments, the carrier has an essentially vertical orientation during the carrier transport. In other words, the carrier may be oriented such that the main surface of the carrier is essentially vertical (vertical +/−10°) during the carrier transport. The guided structure 12 may constitute an upper part of the carrier 10 that is configured to magnetically interact with the plurality of active magnetic bearings 30. A top rail of the base 20 with the plurality of active magnetic bearings 30 may be arranged above the guided structure 12 of the carrier during the carrier transport. The transport direction T may be an essentially horizontal direction. The transport direction T may correspond to a longitudinal direction of the carrier, along which the carrier is moved.

In some embodiments, which can be combined with other embodiments described herein, the carrier 10 has an upper carrier surface. The upper carrier surface faces toward the plurality of active magnetic bearings 30 during the carrier transport. A front part of the upper carrier surface in the transport direction T may constitute the first guided zone 13 and a rear part of the upper carrier surface in the transport direction T may constitute the second guided zone 14. The space between the first guided zone 13 and the second guided zone 14 in the transport direction T which corresponds to the recessed zone 15—may have a length of 1 m or more.

The gap G between the carrier and the base may only be actively controlled in a front part and in a rear part of the carrier, whereas an active control of the gap in a center part of the carrier where the recessed zone 15 is arranged may not be provided. A smooth and reliable carrier transport without the risk of control difficulties due to a varying gap width can be provided.

In some embodiments, which can be combined with other embodiments described herein, the first guided zone 13 and the second guided zone 14 have a dimension of 30 cm or more in the transport direction, and/or the recessed zone 15 may have a dimension of 1 m or more, particularly 2 m or more, in the transport direction T. According to embodiments described herein, actively controlling the gap between the carrier and the base at two distinct zones of the carrier is sufficient for providing a reliable carrier levitation. An active control in the center region of the carrier where the recessed zone is arranged may not be needed. In some implementations, the total length of the carrier in the transport direction may be 2 m or more, particularly 3 m or more. The recessed zone 15 may extend over more than half the length of the carrier in the transport direction.

In some embodiments, the magnetic levitation system may further include one or more controllers 50 for individually controlling the plurality of active magnetic bearings 30 depending on a carrier position along the transportation track.

In particular, a carrier position along the transportation track may be determined, and the plurality of active magnetic bearings may be controlled depending on the carrier position.

For example, the one or more controllers 50 may be configured to actively control at least one magnetic bearing 31 of the plurality of active magnetic bearings 30 when the at least one magnetic bearing 31 faces one of the first guided zone 13 and the second guided zone 14. In other words, when it is determined that the carrier is at a carrier position along the transportation track where the at least one magnetic bearing 31 faces the first guided zone 13 or the second guided zone 14, the at least one magnetic bearing 31 is actively controlled to maintain a constant gap G between the respective guided zone and the base. Alternatively or additionally, the one or more controllers 50 may be configured to switch off the active control of the at least one magnetic bearing 31 when the at least one magnetic bearing 31 faces the recessed zone 15. In other words, when it is determined that the carrier is at a carrier position along the transportation track where the at least one magnetic bearing 31 faces the recessed zone 15, the at least one magnetic bearing 31 may not be actively controlled and/or may be switched off.

In some implementations, the plurality of active magnetic bearings 30 may be controlled such that a first subset of the plurality of active magnetic bearings facing one of the first guided zone 13 and the second guided zone 14 are actively controlled, or switched on, and a second subset of the plurality of active magnetic bearings facing the recessed zone 15 are not actively controlled, or switched off. A third subset of the active magnetic bearings which does not at all face the guided structure 12 of the carrier may not be actively controlled or switched off as well.

Accordingly, in some embodiments, only the active magnetic bearings facing the first guided zone 13 or the second guided zone 14 may be actively controlled, and the remaining magnetic bearings may be switched off, or the active control may be deactivated. A smooth and reliable carrier transport can be ensured.

The plurality of active magnetic bearings 30 may be distributed at constant intervals along the transportation track defined by the base, wherein the interval between two adjacent active magnetic bearings may be smaller than the dimension of the first guided zone 13 (and of the second guided zone 14) in the transport direction T. Accordingly, it can be ensured that at least one active magnetic bearing faces the first guided zone 13 (and the second guided zone 14) at any time during the carrier movement along the transportation track. Typically, at least two active magnetic bearings face the first guided zone 13 and at least two further active magnetic bearings face the second guided zone 14 at any time during the carrier movement.

In some embodiments, which can be combined with other embodiments described herein, the magnetic levitation system further includes a drive unit for moving the carrier 10 along the transportation track. The drive unit may include a linear motor 60 which moves the carrier in the transport direction T by magnetic forces. The linear motor 60 may optionally be arranged at a lower rail of the base that is arranged below the carrier, as is schematically depicted in FIG. 1. The linear motor 60 may interact with a magnetic counterpart provided at a bottom part of the carrier, e.g. with an array of permanent magnets provided at the carrier.

In some implementations, the linear motor 60 may be configured to determine a carrier position along the transportation track and to forward the carrier position to one or more controllers 50 of the plurality of active magnetic bearings 30. For example, the linear motor 60 may include a position detection device, such as an encoder or a resolver, which provides an information about the current carrier position. Accordingly, the one or more controllers 50 of the plurality of active magnetic bearings 30 know about the current carrier position and can control the plurality of active magnetic bearings 30 depending on the current carrier position along the transportation track. Alternatively or additionally, a separate position detection device, e.g. a sensor such as a distance sensor, may be provided for determining the presence of the carrier at a specific position along the base. The sensor output may be forwarded to the one or more controllers of the plurality of active magnetic bearings.

Accordingly, a carrier position along the transportation track can be determined and an information about the carrier position can be forwarded to one or more controllers of the plurality of active magnetic bearings. Hence, the plurality of active magnetic bearings can be controlled depending on the current carrier position, and a subset of the plurality of active magnetic bearings, which faces the recessed zone 15, can be temporarily switched off or deactivated.

According to another aspect described herein, a carrier 10 of a magnetic levitation system 100 is described. The carrier 10 is movable along the transportation track defined by the base 20. A plurality of magnetic bearings for holding the carrier in a contactless or essentially contactless manner may be provided at the base. FIG. 1 shows the carrier 10 according to embodiments described herein during the contactless transport along the base 20.

The carrier includes a guided structure 12. The guided structure 12 may include a magnetic material component having an upwardly facing surface that is directed toward the magnetic bearings of the base during the carrier transport. The guided structure 12 includes a first guided zone 13 and a second guided zone 14 configured to magnetically interact with the plurality of active magnetic bearings 30, and a recessed zone 15 arranged between the first guided zone 13 and the second guided zone 14 in a transport direction of the carrier T. The recessed zone is recessed with respect to the first guided zone 13 and the second guided zone 14, e.g. with a recess depth X of at least 2 mm along the whole longitudinal extension of the recessed zone.

The carrier 10 may further include a holding device for holding a substrate 11 at a holding surface of the carrier. The substrate 11 may be a large-area substrate for display manufacturing having a size of, e.g., several square meters. Alternatively, the substrate 11 may be a semiconductor wafer, or may include a plurality of wafers. The holding device may be a mechanical chucking device, e.g. a clamp, an electrostatic chuck, or a magnetic chuck.

In particular, the substrate 11 may be a large-area substrate having a size of at least 1 $m^2$. The size may be from about 1.375 $m^2$ (1.1 m×1.25 m GEN 5) to about 15 $m^2$, more specifically from about 5 $m^2$ to about 9 $m^2$ or even up to 15 $m^2$. For instance, a substrate can be GEN 7.5, which corresponds to a surface area of about 4.39 $m^2$ (1.95 m×2.25 m), GEN 8.5, which corresponds to a surface area of about 5.7 $m^2$ (2.2 m×2.5 m), or GEN 10, which corresponds to a surface area of about 9 $m^2$ (2.88 m×3.13 m). Even larger generations such as GEN 11 and GEN 12 can be implemented. The carrier 10 has a substrate support surface for supporting and holding the substrate.

The carrier 10 may have a dimension in a vertical direction V of 1 m or more, particularly 2 m or more, or even 3 m or more. The carrier 10 may have a dimension in a longitudinal direction, which corresponds to the transport direction T, of 1 m or more, particularly 2 m or more, or even 3 m or more. The carrier may have a size of 5 $m^2$ or more, particularly 9 $m^2$ or more, or even 15 $m^2$ or more.

A guided structure 12 configured to interact with the base 20 may be provided at an upper part of the carrier. Alternatively or additionally, a bottom part of the carrier 10 may be configured to interact with a linear motor 60 for moving the carrier 10 along the transportation track.

The guided structure 12 includes at least three distinct zones, namely the first guided zone 13, the recessed zone 15, and the second guided zone 14. The guided structure 12 may be configured in accordance with any of the embodiments described herein, such that reference can be made to the above explanations, which are not repeated here.

According to another aspect described herein, a base 20 of a magnetic levitation system 100 is described, wherein the base defines a transportation track for the carrier. The base includes a plurality of active magnetic bearings 30 for generating at least a part of a levitation force for holding the carrier in a floating state. The plurality of active magnetic bearings may optionally be arranged at a top rail of the base, i.e. above the guided structure 12 of the carrier during the carrier transport. The base further includes one or more controllers 50 for individually controlling the plurality of active magnetic bearings 30 depending on a carrier position along the transportation track.

In some embodiments, which may be combined with other embodiments described herein, the one or more controllers 50 are configured to actively control a first subset of the plurality of active magnetic bearings facing one of a first guided zone 13 and a second guided zone 14 of the carrier and to switch off an active control of a second subset of the plurality of active magnetic bearings 30 facing a recessed zone 15 of the carrier arranged between the first guided zone 13 and the second guided zone 14.

In other words, the one or more controllers 50 may be configured to control the plurality of active magnetic bearings 30 such that a first subset is actively controlled, and a second subset that is arranged between actively controlled magnetic bearings of the first subset is not actively controlled or switched off. Accordingly, the carrier can be levitated by applying actively controlled magnetic forces on two distant zones of the guided structure of the carrier while at least one active magnetic bearing that is arranged between actively controlled magnetic bearings is not actively controlled.

Figures 2, 3:
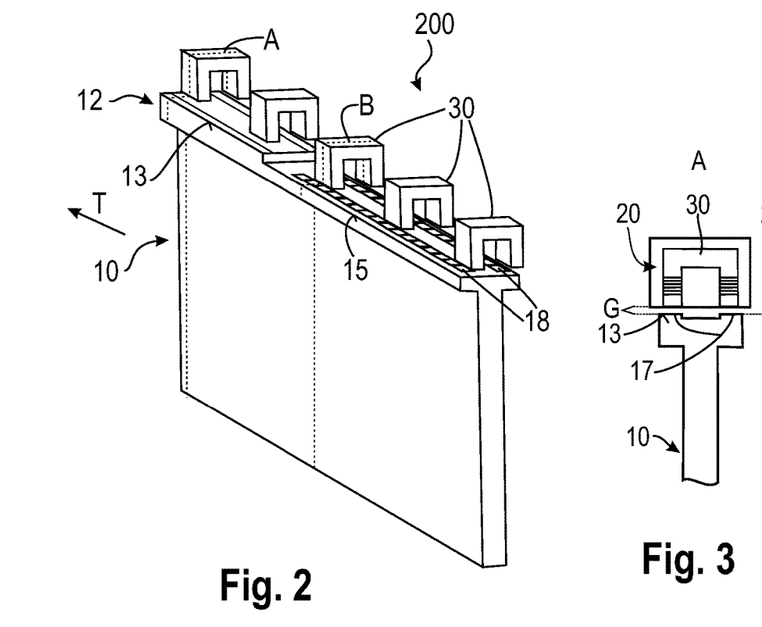
FIG. 2 shows a schematic perspective view of a magnetic levitation system according to embodiments described herein.
FIG. 3 shows a sectional view of the magnetic levitation system of FIG. 2 in a first sectional plane (A)

FIG. 2 shows a schematic perspective view of an upper part of a magnetic levitation system 200 according to embodiments described herein. The magnetic levitation system 200 is similar to the magnetic levitation system 100 of FIG. 1, such that reference can be made to the above explanations, which are not repeated here.

The magnetic levitation system 200 includes a base with a plurality of active magnetic bearings 30 arranged along a transportation track, and a carrier 10 that can be levitated with the plurality of active magnetic bearings 30. Only the upper front part of the carrier 10 is depicted in FIG. 2.

The plurality of active magnetic bearings 30 magnetically interact with a guided structure 12 on the carrier. The guided structure 12 may be arranged at a head part of the carrier and may include a magnetic material, such as magnetic steel, having an upwardly facing surface. The guided structure 12 can be attracted toward the plurality of active magnetic bearings 30, wherein the plurality of active magnetic bearings is actively controlled such that a constant gap G is maintained between the carrier 10 and the base 20 (see FIG. 3).

The guided structure 12 of the carrier includes a first guided zone 13, a recessed zone 15, and a second guided zone, the recessed zone 15 being arranged between the first guided zone 13 and the second guided zone in the transport direction T of the carrier. FIG. 2 shows only an upper front part of the carrier without the second guided zone. The recessed zone 15 may be recessed with respect to the first and second guided zones by a recess depth X of at least 2 mm or more, as is schematically indicated in FIGS. 3 and 4.

The first and second guided zones may include guided surfaces 17 that are flat and lie in the same plane, in particular in an essentially horizontal plane during the carrier transport. The guided surfaces 17 may extend along the transport direction T of the carrier, such that the guided surfaces 17 can interact with magnetic bearings of the plurality of active magnetic bearings. The guided surfaces 17 may be upwardly facing surfaces of the carrier, particularly top surfaces of the carrier.

FIG. 3 shows a schematic sectional view of the magnetic levitation system 200 of FIG. 2 in a first sectional plane (A). The position of the first sectional plane (A) is indicated in FIG. 2. The first sectional plane (A) intersects the first guided zone 13.

Figure 4:
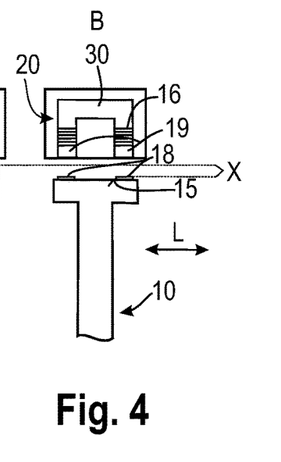
FIG. 4 shows a sectional view of the magnetic levitation system of FIG. 2 in a second sectional plane (B)

FIG. 4 shows a schematic sectional view of the magnetic levitation system 200 of FIG. 2 in a second sectional plane (B). The position of the second sectional plane (B) is indicated in FIG. 2. The second sectional plane (B) intersects the recessed zone 15.

As is schematically indicated in FIG. 3 and FIG. 4, the distance between the first guided zone 13 (and the second guided zone) and the base 20 corresponds to the gap G that is actively controlled and is smaller than the distance between the recessed zone and the base, e.g. by a recess depth X of 2 mm or more.

In some embodiments, which may be combined with other embodiments described herein, a plurality of permanent magnets 18 configured to contribute to a carrier levitation force may be provided at the recessed zone 15.

An attractive magnetic force may act between the permanent magnets 18 of the recessed zone 15 and magnetic bearings of the plurality of active magnetic bearings 30 facing the permanent magnets even if the active control of said magnetic bearings is switched off. The reason is that an active magnetic bearing typically includes an actuator (e.g. an electromagnet) comprising a magnetic material component 19, such as an iron or a steel core of an electromagnet. The permanent magnets 18 of the recessed zone 15 may be attracted toward the magnetic material component 19 of the actuator, even if the actuator is not actively controlled, resulting in a levitation force that acts on the carrier.

In particular, a first (actively controlled) part of the levitation force levitating the carrier may act between a first subset of the plurality of active magnetic bearings and the first and second guided zones, and a second (passive) part of the levitation force levitating the carrier may act between the permanent magnets 18 and a magnetic material component 19 of some of the actuators of the plurality of active magnetic bearings while said actuators may not be actively controlled. The first part of the levitation force is actively controlled to maintain a constant gap G between the first subset of the plurality of active magnetic bearings and the first and second guided zones. Accordingly, it may not be necessary that the whole weight of the carrier is carried by actively controlled magnetic bearings. Rather, at least a part of the weight of the carrier may be carried by the magnetic interaction between passive elements which act as weight compensation elements, namely the permanent magnets 18 and the magnetic material components 19 of the actuators, e.g. iron cores of electromagnets.

In some implementations, a static current can be applied to coils 16 surrounding the magnetic material components 19, in order to adapt the second part of the levitation force. For example, the second part of the levitation force may be adapted to the weight and size of the carrier and/or the substrate that is carried by the carrier. In particular, static currents can be applied to the coils 16 surrounding the actuator irons of the magnetic bearings in order to either increase or decrease the magnetic field between the permanent magnets 18 and the magnetic material components 19.

In some implementations, the plurality of permanent magnets 18 may be arranged in two parallel traces at a distance corresponding to a distance between magnetic material components 19 of the plurality of active magnetic bearings 30. For example, the active magnetic bearings may respectively include two actuator irons arranged at a distance that corresponds to the distance between the two parallel traces, as is schematically depicted in FIG. 4. The levitation of the carrier can be facilitated, since only a portion of the carrier weight is carried by actively controlled magnetic bearings. The two parallel traces may be arranged next to each other in a lateral direction L of the carrier perpendicular to the transport direction T.

In some embodiments, which may be combined with other embodiments described herein, the permanent magnets 18 may provide a side stabilization device that stabilizes the carrier with respect to the base 20 in the lateral direction L perpendicular to the transport direction T. Specifically, the permanent magnets 18 may be arranged such that a restoring force is exerted on the carrier in the case of a displacement of the carrier in the lateral direction L from the equilibrium position that is depicted in FIG. 4. In the equilibrium position of the carrier, the permanent magnets 18 of the carrier are arranged below the magnetic material components 19 of the magnetic bearings. Accordingly, the permanent magnets 18 may contribute both to the carrier levitation force and to a stable carrier position in the lateral direction L.

In particular, according to some implementations, the permanent magnets 18 may be arranged at a lateral distance matching the width of the actuators of the active magnetic bearings, so that a lateral position deviation of the carrier will result in a restoring force toward a center position.

In the following, some of the beneficial effects provided by embodiments described herein will be summarized. According to embodiments described herein, only magnetic bearings arranged above a front section and above a rear section of the carrier in the transport direction may be actively controlled, while the active control of at least some magnetic bearings arranged between the actively controlled magnetic bearings may temporarily be switched off. An active control only at a front section and a rear section of the carrier reduces the risk of the excitation of carrier vibrations because vibration eigenmodes of the carrier typically have large vibration amplitudes in a center of the carrier where no active control is exerted.

In some embodiments, carrier vibrations may induce currents in the coils 16 of the active magnetic bearings which face the recessed zone 15. Therefore, the coils 16 may be used as active dampers for damping carrier vibrations by adjusting the coil currents accordingly. In some implementations, the first subset of the plurality of active magnetic bearings 30 which face the first and second guided zones of the carrier are used for controlling the width of the gap G and, therefore, the vertical carrier position. Optionally, the second subset of the plurality of active magnetic bearings which face the recessed zone 15 of the carrier may be used as tunable dampers for damping carrier vibrations and/or for carrying at least a part of the carrier weight.

Carrier deformations due to thermal variations and/or pressure variations are typically strongest in the center of the carrier. According to embodiments described herein, the gap between the carrier and the base in a center region of the carrier may not be actively controlled. Accordingly, carrier deformations are less problematic with regard to the active control of the magnetic bearings. Namely, two distant gaps in a front section and in a rear section of the carrier may be actively controlled according to embodiments described herein, where carrier deformations are typically less pronounced.

According to some embodiments described herein, the actively controlled magnetic bearings may carry only a portion of the carrier weight, while another portion of the carrier weight may be carried by passive magnetic units which may act on a center section on the carrier. Accordingly, smaller active magnetic units may be used, and actuator irons of the active magnetic bearings can interact with permanent magnets 18 arranged at the recessed zone 15 which act as weight compensation magnets.

Figure 5:
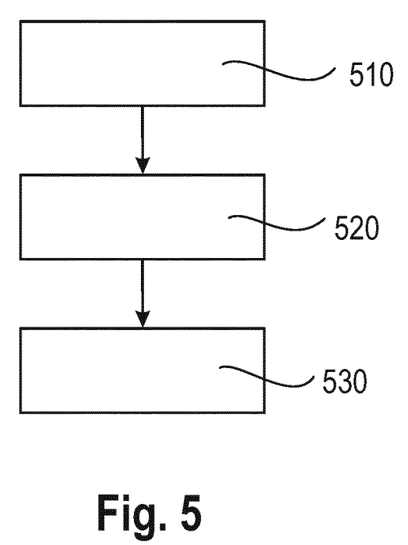
FIG. 5 is a flow diagram illustrating a method of levitating a carrier according to embodiments described herein.

FIG. 5 is a flow diagram illustrating a method of levitating a carrier according to embodiments described herein. The carrier includes a first guided zone 13, a second guided zone 14, and a recessed zone 15 between the first guided zone 13 and the second guided zone 14 in a transport direction T of the carrier.

In box 510, a plurality of active magnetic bearings 30 is controlled for levitating the carrier 10 with respect to a base 20. A first subset of the plurality of active magnetic bearings which faces one of the first guided zone 13 and the second guided zone 14 is actively controlled, or switched on, and a second subset of the plurality of active magnetic bearings which faces the recessed zone 15 is not actively controlled, or switched off. The "active control" of magnetic bearings as used herein relates to an active control of the magnetic bearings depending on a measured width of a gap between the carrier and the base for maintaining a constant gap width, i.e. for maintaining a predetermined vertical carrier positioning with respect to the base.

The first subset of the plurality of active magnetic bearings may be controlled such that a first gap between the first guided zone 13 and the base and a second gap between the second guided zone 14 and the base are kept essentially constant.

In (optional) box 520, the method may further include transporting the carrier 10 along a transportation track defined by the base 20. During the carrier transport, the carrier position along the transportation track is repeatedly determined, and the plurality of active magnetic bearings may be controlled depending on the carrier position.

Specifically, depending on a current carrier position, magnetic bearings of the plurality of active magnetic bearings 30 are allocated to the first subset (and are, therefore, actively controlled) and/or to the second subset (and are, therefore, not actively controlled or switched off). Accordingly, during carrier transport, the active magnetic bearings facing one of the first guided zone and the second guided zone are actively controlled, whereas the active magnetic bearings facing the recessed zone are not actively controlled, or switched off.

In some embodiments, a first part of a levitation force levitating the carrier acts between the first subset of the plurality of active magnetic bearings and the first and second guided zones. A second part of the levitation force levitating the carrier may act between the second subset of the plurality of active magnetic bearings and a plurality of permanent magnets 18, which are provided at the recessed zone 15. The second part of the levitation force may be generated by passive units which are not actively controlled depending on a measured gap width.

In particular, the first part of the levitation force is varied by one or more controllers to maintain a constant distance between the first subset of the plurality of active magnetic bearings and the first and second guided zones, whereas the second part of the levitation force may be generated by passive units, e.g. permanent magnets.

In (optional) box 530, the carrier which carries a large-area substrate is transported into a vacuum deposition chamber, and one or more materials are deposited on the substrate in the vacuum deposition chamber. During the deposition, the carrier may not be levitated, but may be held at a mechanical mount. After the deposition, the carrier may be transported out of the vacuum deposition chamber by the magnetic levitation system in a floating state.

Embodiments described herein can be used for transporting carriers carrying at least one of large-area substrates, glass substrates, wafers, semiconductor substrates, masks, shields, and other objects. The carriers can carry one single object, e.g., a large-area substrate with a size of 1 $m^2$ or more, particularly 5 $m^2$ or 10 $m^2$ or more, or a plurality of objects having a smaller size, e.g. a plurality of semiconductor wafers. The carrier may include a holding device configured to hold the object at the carrier, e.g. a magnetic chuck, an electrostatic chuck, or a mechanical chucking device.

The carrier may have an essentially vertical orientation during the transport (e.g., vertical +/−10°). Alternatively, the carrier may have an essentially horizontal orientation during the transport (e.g., horizontal +/−10°). Specifically, the vacuum deposition system may be configured for vertical substrate transport and processing.

While the foregoing is directed to embodiments, other and further embodiments may be devised without departing from the basic scope, and the scope is determined by the claims that follow.

The invention claimed is:

1. A magnetic levitation system for transporting a carrier, comprising:
 a base defining a transportation track;
 a carrier movable along the transportation track; and
 a plurality of active magnetic bearings provided at the base and configured to face a guided structure of the carrier, the guided structure comprising:
 a first guided zone and a second guided zone configured to interact with the plurality of active magnetic bearings; and
 a recessed zone arranged between the first guided zone and the second guided zone in a transport direction of the carrier, the recessed zone being recessed with respect to the first guided zone and the second guided zone,
 wherein one or more controllers are configured to actively control at least one magnetic bearing of the plurality of active magnetic bearings when the at least one magnetic bearing faces one of the first guided zone and the second guided zone, and wherein the one or more controllers are configured to switch off the active control of the at least one magnetic bearing when the at least one magnetic bearing faces the recessed zone.

2. The magnetic levitation system of claim 1,
 wherein the first guided zone and the second guided zone define a first plane, the first plane having a first distance from the plurality of active magnetic bearings during the carrier transport, and wherein the recessed zone defines a second plane, the second plane having a second distance from the plurality of magnetic bearings greater than the first distance during the carrier transport.

3. The magnetic levitation system of claim 2, wherein the first distance is 2 mm or less, and/wherein the second distance is 3 mm or more.

4. The magnetic levitation system of claim 2, wherein the first distance is about 1.5 mm and the second distance is about 5 mm.

5. The magnetic levitation system of claim 1, wherein the carrier has an upper carrier surface, a front part of the upper carrier surface in the transport direction constituting the first guided zone and a rear part of the upper carrier surface in the transport direction constituting the second guided zone.

6. The magnetic levitation system of claim 1, wherein the first guided zone and the second guided zone have a dimension of 30 cm or more in the transport direction.

7. The magnetic levitation system of claim 1, wherein the one or more controllers are for individually controlling the plurality of active magnetic bearings depending on a carrier position along the transportation track.

8. The magnetic levitation system of claim 1, further comprising a linear motor for moving the carrier along the transportation track, wherein the linear motor is configured to determine a carrier position along the transportation track and to forward the carrier position to one or more controllers of the plurality of active magnetic bearings.

9. The magnetic levitation system of claim 1, wherein a plurality of permanent magnets configured to contribute to a carrier levitation force are provided at the recessed zone.

10. The magnetic levitation system of claim 9, wherein the plurality of permanent magnets are arranged in two parallel traces at a distance corresponding to a distance between magnetic material components of the plurality of active magnetic bearings.

11. A carrier of a magnetic levitation system, the carrier being movable along a transportation track defined by a base, the carrier comprising:
a guided structure including a first guided zone and a second guided zone configured to magnetically interact with a plurality of active magnetic bearings; and
a recessed zone arranged between the first guided zone and the second guided zone in a transport direction of the carrier and recessed with respect to the first guided zone and the second guided zone, wherein the recessed zone has a dimension of 1 m or more in the transport direction.

12. A base of a magnetic levitation system, the base defining a transportation track for a carrier and comprising:
a plurality of active magnetic bearings for generating a levitation force for holding the carrier; and
one or more controllers for individually controlling the plurality of active magnetic bearings depending on a carrier position along the transportation track, wherein the one or more controllers are configured to actively control a first subset of the plurality of active magnetic bearings facing one of a first guided zone and a second guided zone of the carrier and to not actively control a second subset of the plurality of active magnetic bearings facing a recessed zone of the carrier arranged between the first guided zone and the second guided zone.

13. A method of levitating a carrier, the carrier comprising a first guided zone, a second guided zone, and a recessed zone between the first guided zone and the second guided zone in a transport direction of the carrier, the method comprising:
controlling a plurality of active magnetic bearings for levitating the carrier with respect to a base, wherein a first subset of the plurality of active magnetic bearings facing one of the first guided zone and the second guided zone is actively controlled, or switched on, and a second subset of the plurality of active magnetic bearings facing the recessed zone is not actively controlled, or switched off.

14. The method of claim 13, further comprising:
transporting the carrier along a transportation track defined by the base; and
repeatedly determining a carrier position along the transportation track and allocating magnetic bearings of the plurality of active magnetic bearings to the first subset to the second subset depending on the carrier position.

15. The method of claim 13, wherein a first part of a levitation force levitating the carrier acts between the first subset of the plurality of active magnetic bearings and the first and second guided zones, and a second part of the levitation force acts between the second subset of the plurality of active magnetic bearings and a plurality of permanent magnets provided at the recessed zone.

16. The method of claim 15, wherein the first part of the levitation force is actively controlled to maintain a constant distance between the first subset and the first and second guided zones.

17. The method of claim 15, wherein the second part of the levitation force is generated by passive units.

18. The method of claim 15, wherein the carrier has an essentially vertical orientation during transport.

19. A magnetic levitation system for transporting a carrier, comprising:
a base defining a transportation track;
a carrier movable along the transportation track; and
a plurality of active magnetic bearings provided at the base and configured to face a guided structure of the carrier, the guided structure comprising:
a first guided zone and a second guided zone configured to interact with the plurality of active magnetic bearings; and
a recessed zone arranged between the first guided zone and the second guided zone in a transport direction of the carrier, the recessed zone being recessed with respect to the first guided zone and the second guided zone,
wherein the recessed zone has a dimension of 1 m or more in the transport direction.

* * * * *